United States Patent [19]

Green et al.

[11] Patent Number: 5,326,719
[45] Date of Patent: Jul. 5, 1994

[54] THIN FILM GROWTH USING TWO PART METAL SOLVENT

[75] Inventors: Martin A. Green; Stuart R. Wenham, both of New South Wales, Australia

[73] Assignee: Unisearch Limited, Kensington, Australia

[21] Appl. No.: 19,458

[22] Filed: Feb. 18, 1993

Related U.S. Application Data

[63] Continuation-in-part of Ser. No. 592,923, Oct. 4, 1990, abandoned, which is a continuation-in-part of Ser. No. 322,758, Mar. 13, 1989, abandoned.

[30] Foreign Application Priority Data

Mar. 11, 1988 [AU] Australia ............... PI7209
Jun. 23, 1988 [AU] Australia ............... PI8959

[51] Int. Cl.$^5$ ................................. H01L 21/208
[52] U.S. Cl. .................................. 437/119; 437/2;
136/261; 427/74; 117/79; 117/931
[58] Field of Search ............ 427/74; 156/621, 622, 156/624; 437/119, 120, 2, 4; 148/DIG. 101; 65/60.8; 136/258 PC, 261

[56] References Cited

U.S. PATENT DOCUMENTS

| | | |
|---|---|---|
| 923,152 | 6/1909 | Dempster . |
| 3,434,828 | 3/1969 | Cornelison et al. .............. 75/165 |
| 3,753,801 | 8/1973 | Lockwood et al. ............. 437/121 |
| 3,785,884 | 1/1974 | Lockwood ...................... 148/171 |
| 3,897,281 | 7/1975 | Gilbert et al. ................. 437/120 |
| 3,963,536 | 6/1976 | Ettenberg et al. .............. 437/130 |
| 4,159,216 | 6/1979 | Anthony et al. ................ 437/14 |
| 4,159,694 | 7/1979 | Marinelli ...................... 437/119 |
| 4,214,904 | 6/1980 | Kitchen ........................ 75/165 |
| 4,225,367 | 9/1980 | Anglerot ................... 136/258 PC |
| 4,447,391 | 5/1984 | Mizuhara ...................... 420/456 |
| 4,571,448 | 2/1986 | Barnett .................... 136/258 PC |
| 4,717,688 | 1/1988 | Jaentsch ....................... 437/120 |

FOREIGN PATENT DOCUMENTS

| | | |
|---|---|---|
| 50/117632 | 9/1975 | Japan . |
| 54/72672 | 11/1979 | Japan . |
| 59/163819 | 9/1984 | Japan . |
| 3-185877 | 8/1991 | Japan .......................... 437/2 |

OTHER PUBLICATIONS

Faust et al., "The Influence of Solvent and Impurities on the Habit and Morphology of Semiconductor Crystals" *8th International Congress of Crystallography* (1969) (Inspect abstract 70:178958).
Girault et al. "Liquidus Curves of some Metal-Silicon Systems" *C. R. Hebd. Seances Acad. Sci B* (1977) 284(1):1-4.
Green, M., "Limits on the Open-Circuit Voltage and Efficiency of Silicon Solar Cells Imposed by Intrinsic Auger Processes," *IEEE Transactions on Electron Devices* (May 5, 1984) vol. ED-31, No. 5, pp. 671-678.
Green et al., "High-Efficiency Silicon Solar Cells," *IEEE Transactions on Electron Devices* (May 5 1984) vol. ED-31, No. 5, pp. 679-683.
Grovenor et al., "Metal Induced Grain Growth in Germanium and Silicon Thin Films" *Thin Films and Interfaces II*, Proceedings of the Symposium, J. E. E., Baglin et al., eds., New York, USA: North Holland (1984) pp. 305-310 (Inspect abstract 85:2455223).
Hawley, G. G. *The Condensed Chemical Dictionary*.

(List continued on next page.)

*Primary Examiner*—Terry J. Owens
*Attorney, Agent, or Firm*—Morrison & Foerster

[57] ABSTRACT

A method of coating a material surface with thin film silicon comprises dissolving silicon in a metal solvent to form a solution and subsequently deposited the dissolved silicon from the solution by controlling the temperature of the solution and thereby depositing a layer of silicon onto the material surface. The metal solvent is preferably a mixture of gold and a metal or metals which either have a melting point below the deposition temperature range or which form a eutectic with gold and have a eutectic temperature below the deposition temperature range. The temperature of the solution is controlled so that the silicon becomes super saturated in the solution and is deposited out of solution onto the material surface.

27 Claims, 12 Drawing Sheets

OTHER PUBLICATIONS (1977) 9th ed. New York, Van Nostrand Reinhold Co., p. 28.

Hellawell, A. "The Growth and Structure of Eutectics with Silicon and Germanium" *Prog. Mater. Sci.* (1970) 15(1):3–78 (Inspect abstract 71:230502).

Millard, E. B., "Physical Chemistry for Colleges," (1946) 6th ed., McGraw Hill Book Co., Inc. pp. 437–437.

Saidov et al., "Solution and Etching in Si in Tin Solutions" *Inorgan. Mater.* (1972) 8(12):1825–1827.

Day, S. K. et al., "Heat exchanges and columnar growth in electron beam evaporation of silicon films for solar cell applications," J. Vac. Sci. Technol., vol. 15, No. 5 (Sep./Oct. 1978) pp. 1739–1745.

Saito, T. and Y. Seki, "Enhanced crystallinity of silicon films grown from eutectic melt on aluminum sheets," Applied Physics Letters, vol. 29, No. 9 (Nov. 1, 1976) pp. 600–602.

THIN FILM GROWTH USING TWO PART METAL SOLVENT

CROSS-REFERENCES

This application is a continuation-in-part of our earlier filed, now abandoned, U.S. application Ser. No. 07/592,923 filed on Oct. 4, 1990 which is a continuation-in-part of our earlier filed, now abandoned, U.S. application Ser. No. 07/322,758 filed Mar. 13, 1989, which applications are incorporated herein by reference in their entirety and to which applications we claim priority under 35 USC §120. Further, we claim priority under 35 USC §119 with respect to earlier filed Australian application PI 7209 filed Mar. 11, 1988 and PI 8959 filed Jun. 23, 1988.

FIELD OF INVENTION

The present invention relates to a method of coating materials with thin films of silicon which coated materials are used in various electronic applications, such as thin film silicon solar cells. More particularly, the invention provides a method of manufacturing such solar cells using the thin film coating technology.

BACKGROUND OF INVENTION

At present, the fabrication of silicon solar cells involves the use of self-supporting crystalline or polycrystalline wafers. However, there are a number of advantages which can be obtained by the fabrication of silicon solar cells in the form of thin silicon films on a supporting layer. Accordingly, there is an increasing amount of interest with respect to commercially applicable methods of fabricating silicon solar cells in thin-film form.

There is also an increasing interest in depositing silicon of electronic quality over large areas for consumer applications such as liquid crystal displays for application as television screens. One such deposition technique is carried out by first dissolving silicon in a molten metal so that the melt is saturated with silicon and then cooling. Upon cooling, the amount of silicon which can be dissolved in the melt decreases. The excess silicon can be made to precipitate, out onto a substrate, at a controlled rate.

At present, tin (Sn) is the most commonly used metal for dissolving silicon for subsequent deposition. Tin is desirable in that it is electrically quite inert in silicon. Accordingly, the unavoidable incorporation of tin in the deposited silicon layer does not detract from the layer's electronic properties. However, tin is not desirable in that high temperatures (greater than 900° C.) are required to dissolve much silicon in tin. The high deposition temperature severely limits the choice of substrate material due to thermal mismatch considerations. A further limitation upon substrate choice as well as upon the choice of processing conditions and cleanliness requirements is provided by the much higher prospects for contamination of the silicon layer by other impurities at high temperatures.

Gold forms a eutectic with silicon and has a unique ability to dissolve large amounts of silicon at low temperatures. The eutectic composition consists of about 18% silicon (atomic basis) with a corresponding eutectic temperature of about 363° C. This means that at any temperature higher than this, a molten solution of silicon in gold can be formed with the silicon content being at least as high as at the eutectic. Although gold is very detrimental to the electronic properties of the silicon layer, (when incorporated into this layer in even very small quantities) the low deposition temperature means that virtually no gold is incorporated into the lattice structure of the silicon layer. Similarly, only small quantities of other impurities will be incorporated at such low temperatures. Accordingly, processing can be carried out using relaxed cleanliness requirements for (1) the substrate material; and (2) the deposition equipment. In addition, the purity requirements of the substrate and the solutions employed can be reduced. The low deposition temperatures also reduce thermal mismatch problems between the deposited silicon layer and the substrate.

The use of gold in silicon deposition-processing is not desirable because of the high solubility of silicon in gold at the eutectic. Large amounts of silicon required to form a melt at low temperatures giving rise to difficulties in controlling the precipitation rate of silicon from the solution upon cooling. This reduces the crystallographic quality of the deposited film and also gives rise to the possibility of desirable macroscopic gold inclusions in the deposited film.

SUMMARY OF THE INVENTION

An efficient and economical method of coating a material surface with a highly pure thin film of silicon is disclosed. The method involves dissolving silicon in a molten metal solvent to form a solution. The dissolving is carried out a first temperature such that the percentage of silicon in the solution is greater than the saturated percentage of silicon at a second temperature. The solution of silicon and metal is then brought into contact with an area of a material surface which is to be coated. The temperature of the silicon/metal solution is controlled within the range between the first temperature and the second temperature in such a manner so as to control the rate of deposition of silicon from the solution onto the material surface. By using this method, a highly pure silicon thin film can be deposited in a controlled manner on the material surface. In accordance with the invention it is important that the silicon/metal solution be particularly comprised so as to obtain the desirable results of the invention. In order to obtain the desirable results of the invention, the molten metal solvent used in forming the silicon/metal solution is comprised of a mixture of at least two metals. The two metals include a first metal which, when pure, forms a low temperature eutectic with silicon at a first eutectic temperature which is below the melting point of the metal. The molten metal solvent also includes a second metal which has a melting point below the first eutectic temperature. In accordance with a preferred embodiment, the first metal is gold and the second metal is tin, and the gold and tin are mixed in the molten metal solvent in a ratio by weight in the range of from about 1:4 to about 3:7 of gold:tin.

In particular the invention provides a method of coating a material surface with a thin film of silicon comprising the steps of dissolving sufficient silicon in a molten metal solvent at a first temperature such that the percentage of silicon is greater than the saturated percentage level at a second temperature, bringing the silicon/metal solution into contact with an area of the material surface, and controllably varying the temperature of the silicon/metal solution from the first towards the second temperature at a rate corresponding to a desired rate of deposition of silicon, and wherein the molten metal solvent comprises a mixture, or an alloy, of: a first metal which, when pure, forms a low temperature eutectic with silicon at a first eutectic temperature which is below the melting point of the metal, and at least one second metal which has, in the pure state, a melting point below the first eutectic temperature or which, if forming an alloy with the first metal, forms a eutectic with said first metal at a eutectic temperature below the first eutectic temperature.

The invention further provides a method of coating a material surface with thin film silicon by dissolving silicon in a molten metal solution, bringing the silicon/metal solution into contact with an area of the material surface, and by controllably varying the temperature of the silicon/metal solution at different rates about the area so as to obtain different desired rates of deposition of silicon about the area.

An important aspect of the invention is a solution growth method which is used to deposit a thin film semiconductor coating on a supporting substrate. The method comprises dissolving the semiconductor in a molten metallic solvent, subsequently precipitating the semiconductor from the solution comprised of the metal solvent and dissolved semiconductor into a supporting substrate. The method is characterized in that the solvent is a mixture of a first and a second metal. The first metal forms a eutectic with the semiconductor having a eutectic temperature substantially below the melting point of the first metal when the first metal is substantially pure. The second metal or mixture of second metals which, in their substantially pure state, have a melting point below the eutectic temperature of the first metal and the semiconductor and the second metal or mixture of second metals being substantially completely mixable with the first metal. The first metal is preferably gold and the semiconductor is preferably silicon.

A primary object of the present invention is to provide a method of depositing a thin layer of silicon onto the surface of a material by controlling the temperature of a silicon/metal solution so as to controllably regulate the supersaturation of the silicon within the solution and thereby control the evolution silicon from the solution onto the material surface and form the thin silicon film.

Another object of the invention is to provide a silicon/metal solution, which solution is comprised of silicon and at least two metals, which metals are preferably gold and tin, and/or functional equivalents thereof with respect to the methodology of the present invention. For example, the method can comprise the steps of dissolving silicon in a solution of gold and tin wherein the gold and tin are present in a ratio of from 7:3 to 4:1 (gold:tin by weight) to form a solution of silicon, gold and tin, the dissolving being carried out at a first temperature below about 600° C. until the silicon reaches approximately the saturation level of silicon in the solution; wetting a surface of the glass sheet by contacting the solution with the sheet and maintaining the surface in contact with the solution; precipitating silicon from the solution onto the surface by lowering the temperature of the solution; and controlling the rate of growth and final thickness of the silicon film by controlling the rate of change of the solution temperature and the length of time the surface remains in contact with the solution.

An advantage of the present invention is that the processing can be carried out in an efficient and economical manner.

Another advantage of the present invention is that the thin silicon film formed using the method of the invention is highly pure and uniform with respect to its composition, thickness, and surface smoothness.

A feature of the present invention is that the method can be carried out using relatively low temperatures.

Another object of the invention is to provide silicon coated materials wherein the silicon coating is provided on the material by using methods of the invention to thereby obtain a highly pure and uniform silicon coating on the material.

Another object of the invention is to provide soda lime glass sheet surfaces which have silicon coated thereon wherein the silicon coating is provided by a method of the invention.

Yet another object of the invention is to provide for solar cells which solar cells include soda lime glass sheets having silicon coated thereon wherein the silicon coating is provided by a method of the invention.

An advantage of the present invention is that thin film silicon solar cells can be efficiently and economically produced using the silicon coating methods of the invention.

These and other objects, advantages and features of the silicon-deposition method of the invention will become apparent to those persons skilled in the art upon reading the details of the compositions, steps, processing and usage as more fully set forth below, reference being made to the accompanying drawings forming a part hereof.

BRIEF DESCRIPTION OF THE DRAWINGS

This invention may be better understood and its numerous objects, advantages and features will become apparent to those skilled in the art by reference to the accompanying drawings as follows.

DETAILED DESCRIPTION OF THE PREFERRED EMBODIMENTS

Figure 1:
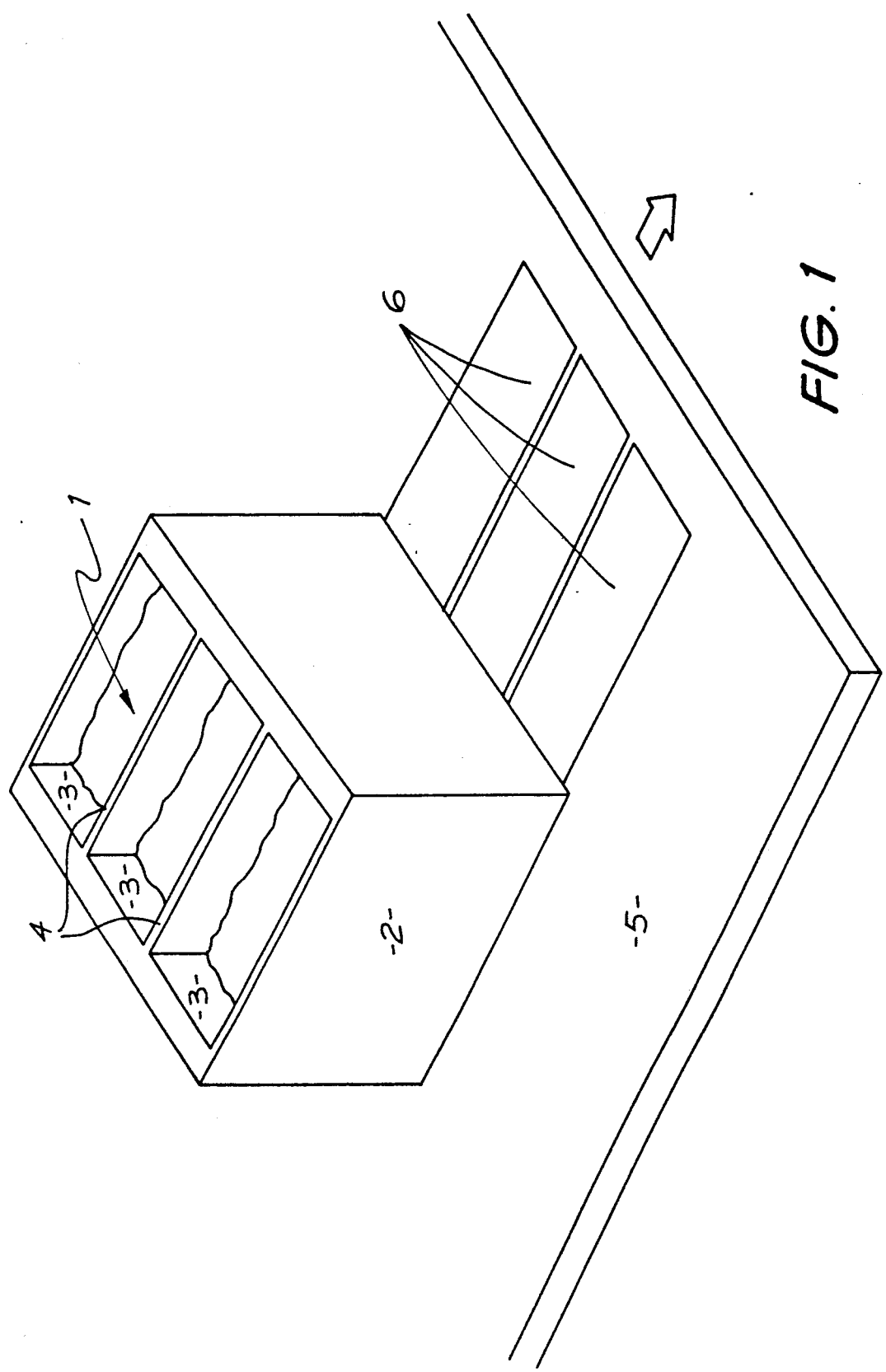
FIG. 1 illustrates a continuous multiple cell formation technique of the invention.

Before the present method of depositing silicon films on a material is described, it is to be understood that this invention is not limited to the particular process steps or metals described as such steps and metals may, of course, vary. It is also to be understood that the terminology used herein is for the purpose of describing particular embodiments only, and is not intended to be limiting, since the scope of the present invention will be limited only by the appended claims.

It must be noted that as used in this specification and the appended claims, the singular forms "a" "an" and "the" include plural referents unless the context clearly dictates otherwise. Thus, for example, reference to "a metal" includes mixtures of metals of the type being described and reference to "the silicon deposition step" includes one or more such steps of the general type being described, and so forth.

Unless defined otherwise, all technical and scientific terms used herein have the same meaning as commonly used and understood by one of ordinary skill in the art of silicon films, silicon deposition and solar cells. Although variations on the methods and materials similar to or equivalent to those described herein may be used to practice the methods of the invention and/or obtain the products produced by the methods of the invention, preferred methods and materials known to the applicants are described herein. Publications mentioned in this disclosure are incorporated herein by reference in order to disclose the specific subject matter referred to in connection with the publication.

In accordance with the present invention, it is necessary to choose at least one metal which is referred to a metal of low melting point and at least one metal which forms a eutectic with a suitable semiconductive material such as gold at a low eutectic temperature. Although the inventors have found that certain metals are clearly useful and preferred in connection with the present invention, the general concept of the invention is not limited by the particular metals disclosed herein.

In general, the method of the invention involves dissolving silicon in either an alloy or in a mixture of melted metals to form a solution and then regulating the temperature of the solution in order to cause the silicon in the solution to precipitate out of solution and deposit on a substrate to be coated. Applicants have determined that by choosing particular metals based on their physical characteristics (melting point, solubility, etc.), it is possible to obtain an improved method by which silicon films can be efficiently and economically deposited on a given substrate surface. Once the solution is formed by dissolving the silicon in the metals, the silicon is generally deposited out by lowering the temperature of the solution so that the concentration of silicon within the solution will exceed its saturation point (become super saturated) and precipitate out of solution. However, it is possible to cause the silicon to precipitate out of solution by raising the temperature when the solution is brought into contact with a source of additional metal, such as tin, which additional metal (at the higher temperature) will enter the solution and force silicon to be precipitated out of solution. Based on these concepts, it can be seen that the method of the invention can be carried out in a variety of different ways using a variety of different metals and proportional amounts of such metals. Some specific examples and preferred embodiments are given below.

Examples of suitable metals with a low melting point include Bi, Cd, Ga, Hg, In, Pb, Sn, Tl and Zn. Examples of metals which form a eutectic with gold with a low eutectic temperature include Al, Bi, Cd, Ga, In, Pb, Sb, Sn and Tl and mixtures such as low temperature eutectics containing the above metals or metals completely miscible with gold such as Ag, Cu, Ni, Pd and Pt. Other metals may be added to the molten metal solvent for other purposes such as doping the silicon and examples of such metals include Al, As, Ga or Sb. The combination of Ag with Sn and/or Bi are particularly preferred as metal solvents to which silicon is added.

The advantage of mixing such metals with gold is that the solubility of silicon in these metals or mixtures of metals is invariably lower than that of silicon in gold at temperatures of interest (provided such temperatures are above the gold-silicon eutectic temperature). When these metals of initial mixtures are mixed with gold, the solubility of silicon in the final mixture at the temperatures of interest will almost invariably be bound at the higher extreme by its solubility in gold at the lower extreme by its solubility in the initial mixture. In practice, it is found that the solubility in gold can be greatly reduced in this manner. For example, the solubility (in atomic percent) we have measured in gold-tin mixtures at 410° C. decreases from approximately 20% for pure gold to approximately 5.3%, 0.5%, and 0.2% as 20%, 25% and 30% of tin by weight is added to gold.

The advantage of this reduced solubility is that growth rates of the silicons being deposited from the silicon/metal solutions are easier to control resulting in better film quality and reduced inclusions. A further advantage is that it is possible to extend growth temperatures to lower temperatures than possible with gold alone. For example, a mixture of 20% tin by weight with gold remains molten to temperatures as low as 270° C., appreciably lower than the gold eutectic of 363° C. These temperatures represent the lower bounds on the growth temperatures from the respective solutions.

The silicon films deposited in this way could be used, inter alia, as the active layers of solar cells or as the substrates for transistor fabrication for a liquid crystal display television screen. Other uses will undoubtedly be available and will become apparent to those persons skilled in the art upon reading this disclosure.

Metals such as tin that have a strong effect upon the solubility of silicon in gold allow a variation upon the method of growth of semiconductor films from molten metal alloy solutions. The addition of tin to a solution of silicon in gold greatly decreases the solubility of the silicon in the solution. If originally saturated with silicon, silicon would precipitate out due to the addition of tin. If a solution of gold, silicon and tin were saturated with both silicon and tin and placed in contact with a tin rich compound such as pure Sn or AuSn or tin rich alloys of such materials, heating would cause more tin to dissolve in the solution. The increased concentration of tin in the solution would decrease the solubility of silicon causing silicon to precipitate out. Hence, solution growth could be obtained in this particular embodiment by heating the solution rather than by the established approach of cooling it. This could have numerous advantages such as in the control of convection currents and of impurity and inclusion incorporation into the film.

Experiments have shown that while pure bismuth and lead have virtually no ability to dissolve silicon, gold added in the region of 5-50% by weight to either of these metals provides an alloy with good control of silicon deposition at below 400° C. and with the lower gold content the alloys can be produced relatively cheaply.

The method can be extended to other molten metal alloy solvents and to other dissolved semiconductors for example Sb/Au alloys for the molten alloy and group III-V compounds and their alloys as the semiconductor.

The suitability of molten metal solvents for use in connection with a method of the invention can be easily determined. First it is necessary to document the melting and eutectic point temperatures. If these temperatures are favorable, experimentation is carried out regarding the ability of the solvent to dissolve the desired group III-V compound or alloy. It is preferred that the solubility of the group III-V compound or alloy in the metal solvent is low in the desired deposition temperature range, say 0.1% to 5% (atomic).

In one embodiment the above methods will include the step of incorporating Ge into the solution such that the material deposited onto the supporting layer will be an alloy of Si and Ge.

By incorporating Ge into the solutions so that it is incorporated into the deposited film additional advantages arise. The addition of Ge tends to reduce the deposition temperature as well as the bandgap of the $Si_x Ge_{1-x}$ alloy which will be deposited. As taught by Green (M. A. Green, IEEE Trans. Electron Devices, Vol. ED-31, pp. 681-689, 1984, incorporated herein by reference), recombination at cell surfaces becomes more important than recombination in bulk regions as cell thickness decreases. By incorporating more Ge into the bulk regions or part of the bulk region of thin cells than at surfaces, a balance between surface and bulk recombination can be maintained. This will give a performance advantage arising from increased light absorption in the reduced bandwidth bulk regions.

In some embodiments of the invention, an optically transparent seeding layer is used between the supporting layer and the deposited silicon (or $Si_x GE_{1-x}$) film. Throughout the specification and claims, x is any number such that the atom or atoms it is associated with become electron compatible with and allow the formation of bonds with the other atom or atoms in the molecule. The purpose of this layer is to establish a good crystalline structure onto which the silicon can be deposited with a similarly good crystalline structure. This removes the dependency on using crystalline quality silicon for the supporting substrate layer. The seeding layer will typically have a relatively poor crystalline structure at the interface with the supporting layer which will improve as the layer grows away from the supporting layer. By making the layer transparent, the distance required to establish good crystallinity becomes non-critical. Preferred choices for the seeding layer are materials such as ZnS, CaF$_2$, GaP, A/P and BP onto which the epitaxial growth of silicon is possible. These can be deposited by any one of a variety of known techniques although deposition from metallic solution gives the highest level of consistency with the subsequent deposition of the silicon layer. This layer could also serve to passivate the surface of the silicon film immediately in contact.

In a preferred embodiment of the invention a self-supporting glass sheet is used as a supporting superstrate for the deposition of silicon film. The lower the deposition temperature, the wider the range of glass type which can be used. For example, at high temperatures fused silica or vicor could be used. Borosilicate glass would be suitable at lower temperatures. At deposition temperatures below 600° C., less expensive soda lime glass would be used. In present solar cell modules based on self-supporting silicon wafers, low-iron soda lime plate glass of about 3 mm thickness generally is used as the structural layer within the module. Lowest cost would occur if the supporting superstrate of the present invention deviated as little as possible from this baseline.

Nucleation of crystal growth centers on the glass superstrate could be encouraged by the formation of structure on the side of the superstrate onto which the film or its seeding layer is deposited. Structure could be formed by mechanical processes such as rolling or by chemical or plasma etching. This structure could then encourage preferred orientations in the crystal film. It would also affect the direction of light entering the silicon film through the superstrate. The formation of structure on the superstrate could be used to help trap weakly absorbed light into the silicon film. An example of such a desirable geometrical structure which could be formed in the superstrate to enhance such effects would be small pyramids, preferably impressed into the superstrate, tilted with respect to the original superstrate surface. The less controlled structure which results when glass is chemically etched would also be suitable. Any other method which produces a high density of small pores in the surface of the surface onto which the films are to be deposited would also be suitable, such as plasma etching.

According to further aspects of the invention, all the cells of the entire module are formed simultaneously on the supporting substrate. Several new techniques have been developed to implement the simultaneous formation of multiple cells. One is the portioned solution growth method shown in FIG. 1. In this case the molten solution 1 containing the dissolved silicon is held in a suitable container 2 divided into compartments 3 by thin partitions 4. These portions 4 may be fixed with respect to the container 2 or may be able to slide with respect to it to provide more intimate contact with the layer (the workpiece 5) onto which the solution film 6 is to be deposited. The purpose of the partition 4 is to prevent the solution from wetting the workpiece 5 in the region immediately underneath or adjacent to the partition 4. By cooling the molten solution 1, or by arranging for a temperature gradient from its upper levels held in intimate contact with a source of silicon (and possibly Ge) to the workpiece 5, silicon will be deposited. If the workpiece 5 is held stationary, the deposition will occur in the regions of the workpiece 5 under the separate chambers 3. The deposited layers 6 will reflect the geometry of the chambers 3 in this case. If the workpiece is moving slowly with respect to the solution, stripes 6 of deposited silicon films (as shown in FIG. 1) can be formed.

Although the partitions 4 represent a mechanical solution as described above to prevent deposition in selected areas, thermal or electrical solutions are also possible which can achieve the same purpose. For instance, by holding the partitions 4 at higher temperature than the solution, any solution under the partition 4 would be hotter than the surrounding solution 1 and hence supersaturation with silicon in these regions could be prevented. This would prevent deposition in these regions.

If the workpiece 5 is moving with respect to the solution 1, a point source of heat such as provided by a heated needle could be used to give the strip structure to the deposited layer 6 similar to the final result of FIG. 1. The heated solution 1 in the vicinity of the needle could be used to dissolve a small region in the deposited film as it passes underneath. If the workpiece 5 is transparent, a laser beam illuminating the solution from underneath the workpiece 5 could provide a convenient source of such localized heat for this purpose. If a strip laser were used, deposition could be prevented along the strip illuminated by the laser as in the case of the heated partition.

Figure 2:
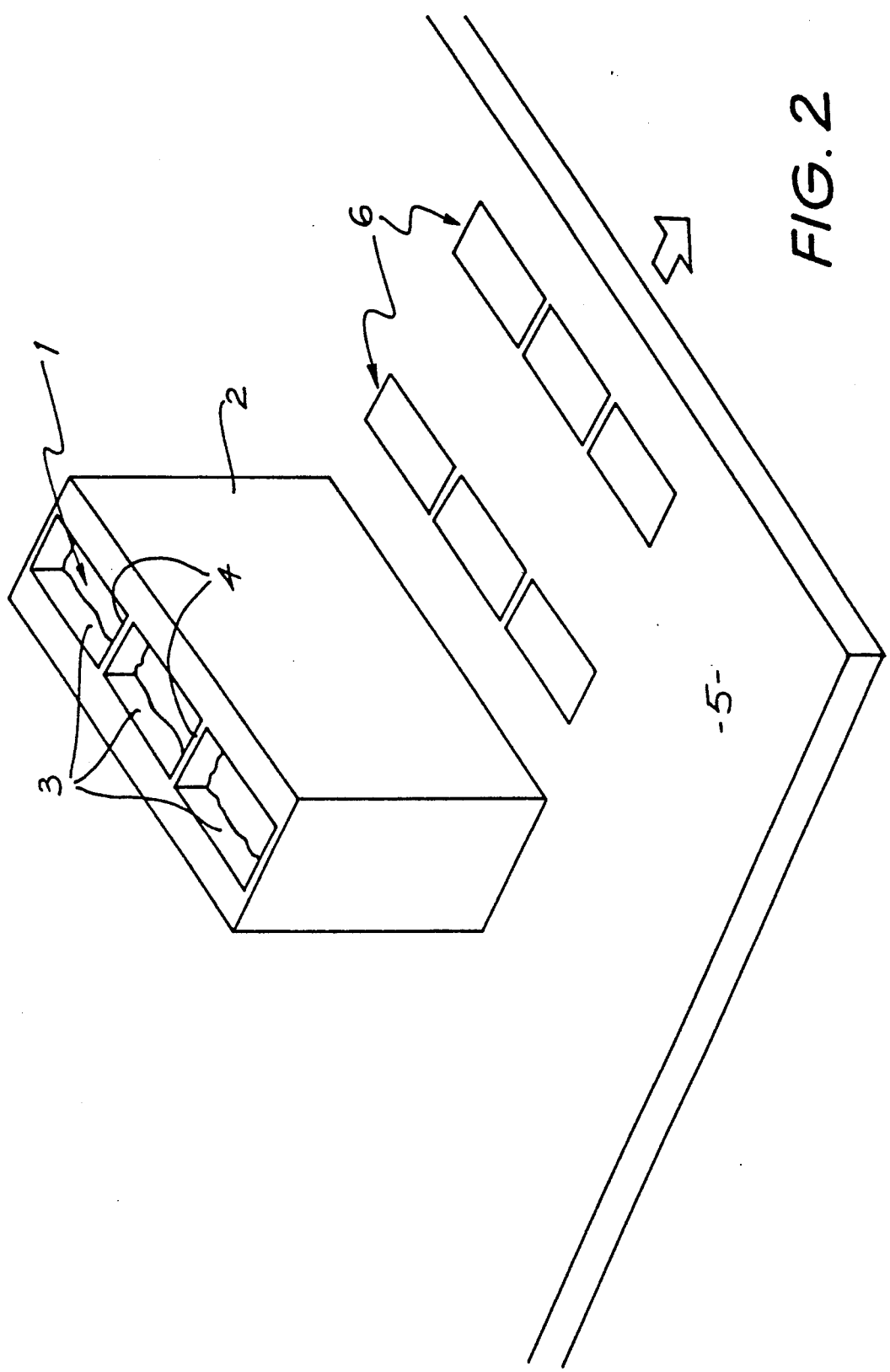
FIG. 2 illustrates a discrete multiple cell formation technique of the invention.

The thickness of the deposited layers 6 can be controlled by the temperature of the solution 1 including gradients within it as well as the length of time the solution 1 stays in contact with the workpiece 5. The doping level in the deposited layer 6 can be controlled by depositing the silicon from a metal solution where the solvent 1 acts as a dopant in silicon, or by dissolving dopants in the solution, or a combination of the above. As shown later, successive layers of different dopant level or type can be built up aligned or offset with respect to each other to give desirable device structure. If the workpiece 5 is stationary, a great deal of flexibility is available as to the spatial distribution of these layers. If the workpiece 5 is moving, as in FIG. 1, additional techniques ar necessary to allow variations in deposited film properties in the direction of the workpiece motion. A technique for achieving this would be by cycling the temperatures of the metallic solutions 1. When the temperature is highest near the substrate, the solution 1 will no longer be supersaturated with silicon and deposition can be made to stop. When coolest, deposition will be strongest. Alternatively, localized heating or cooling of substrate 5 provides the same effect with perhaps more ease due to the lower thermal mass of the substrate 5 relative to the metallic solutions 1. By either means, patterned structure in the direction of motion can be obtained as illustrated in FIG. 2.

As indicated above, one preferred embodiment of the invention uses a combination of gold with tin and/or bismuth as the solvent for dissolving silicon. The solution formed is then used in a preferred method of the invention which is carried out by maintaining a temperature gradient, or more basically a composition gradient, throughout the solution during the deposition process step. There are a number of means for maintaining the temperature gradient including localized, direct heating. In accordance with a preferred embodiment of the invention, the step of controllably varying the temperature of the solution involves varying the average temperature of the solution while maintaining a temperature gradient across the contact area between the solution and the material surface where the silicon is to be deposited so as to affect a desired rate of deposition of silicon which is grated across the contact area between the solution and the material surface.

The role of temperature gradients from top to bottom of the molten solution has already been mentioned. Lateral temperature gradients within the solution can also be used to give patterned structure as in FIG. 2.

Using the techniques as described, solar cell structures can be built up using overlying strips 6 of deposited silicon of different dopant concentration, thickness and Ge content. An advantage of the present invention's ability t overlap and offset layers relative to each other is that structures such as those described can be formed without requiring separate masking, photolithography or additional processing steps.

Figure 3:
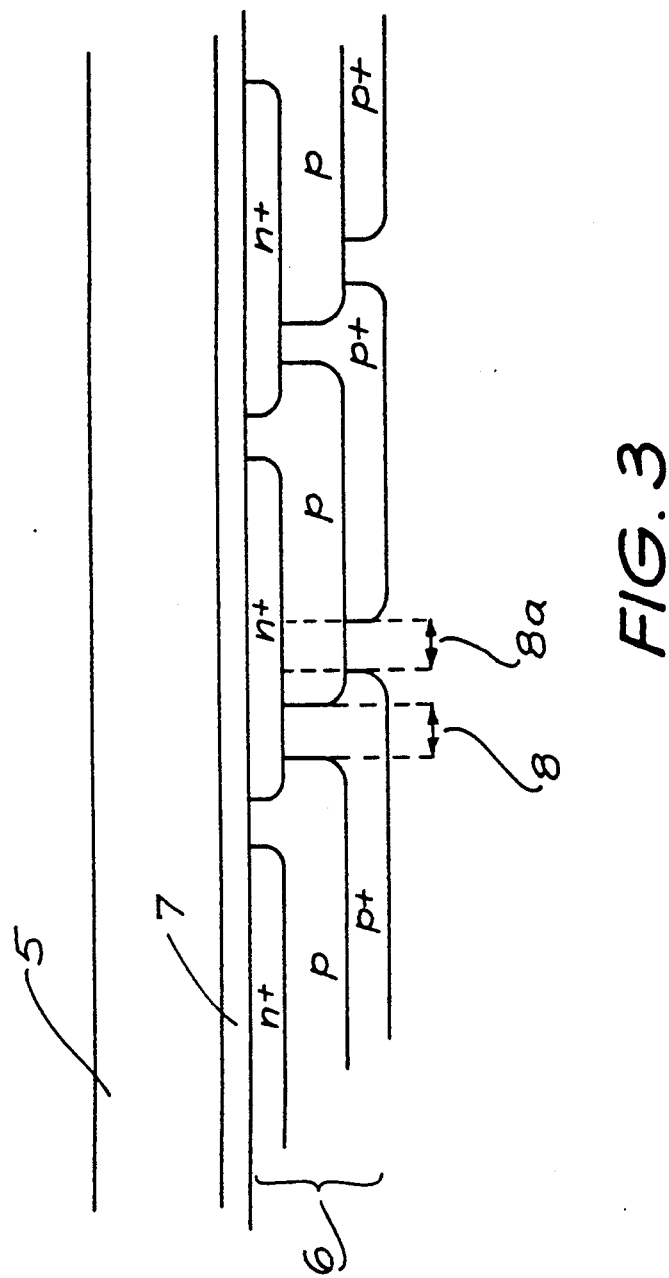
FIG. 3 is a cross-section of a solar cell device of the invention having multiple parallel solar cell strips which overlap.
Figure 4:
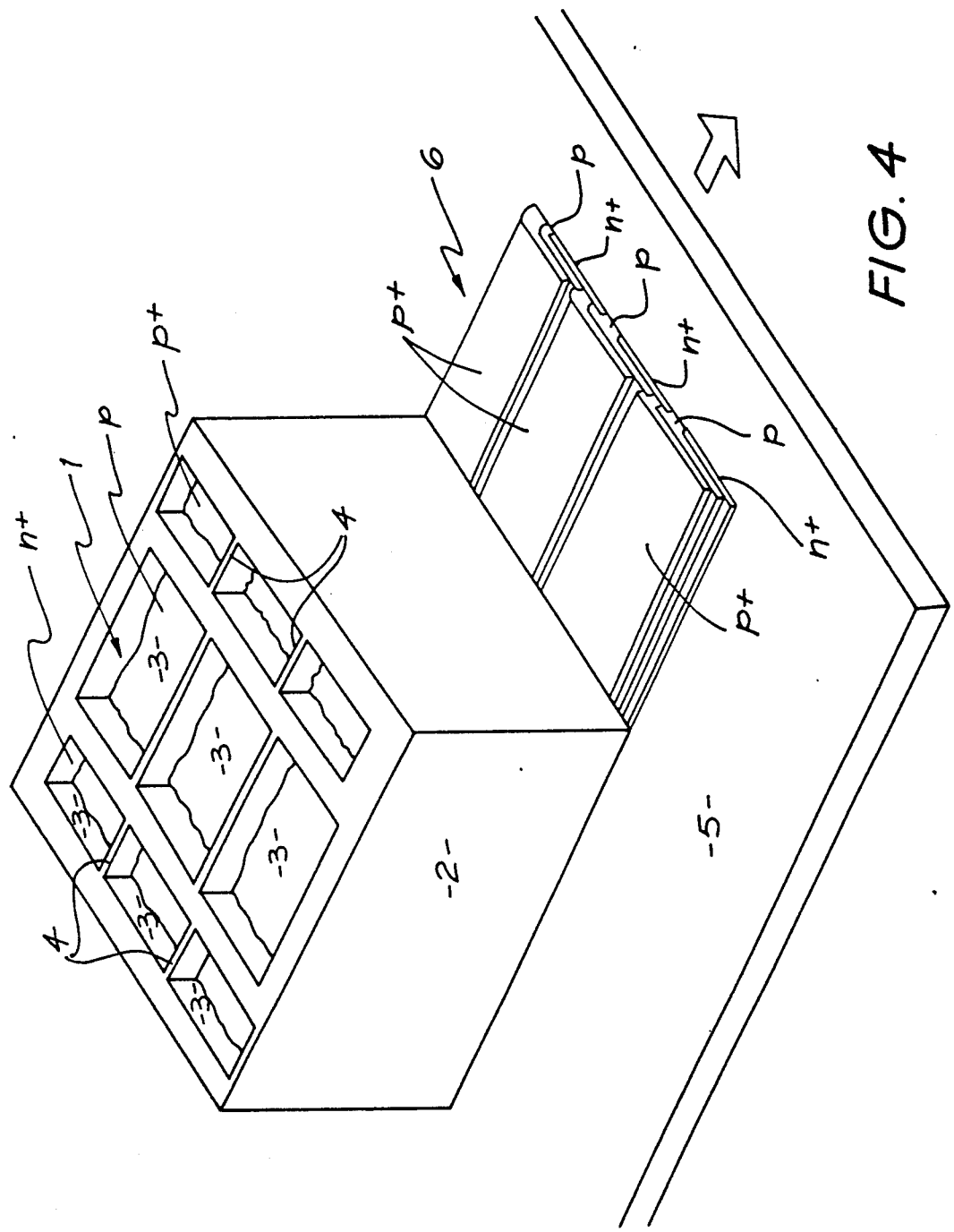
FIG. 4 illustrates a continuous multiple layer, multiple cell formation technique of the invention.
Figure 5:
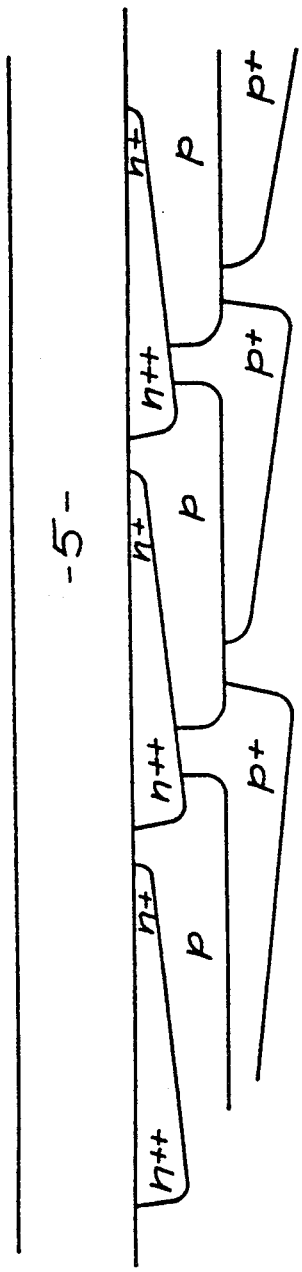
FIG. 5 is a cross-section of a solar cell which is a variation of the device in FIG. 3, having normally-doped regions and heavily doped regions.

FIG. 3 shows one such implementation. The structure in the direction into the page remains the same so the different layers shown take the form of long strips 6. A schematic of the process by which the layers could be deposited is shown in FIG. 4. Shown in FIG. 3 are several solar cells each with an n+ −p−p+ junction structure as well known in the art. The cells, however, are connected together in a series connection at the areas 8 where contact is made between the n+ and p+ region. Contacts between such heavily doped regions, instead of acting as a rectifying junction, act as a low resistance "ohmic" contact. Alternatively, rectifying qualities between the n+ and p+ regions could be destroyed by deliberately damaging the crystallographic quality of those regions. Also incorporated into the cells is an "isolation region" 8a whereby the contact region 8 is isolated from the main body of the cell by the high lateral resistance of the p-type region. The n+ and p+ regions need to be sufficiently highly doped and sufficiently thick to present a small lateral resistance to current flow. This is most challenging for the n+ region since there is a conflicting constraint on its thickness. This is imposed by the fact that it must be sufficiently thin for carriers generated by light near its interface with the superstrate or seeding layer to find their way to its junction before recombining. One approach to reducing the losses involved in this tradeoff is to arrange for a lateral temperature gradient within the molten bath 1 to give a lateral thickness variation or a lateral doping level variation or a combination of the above. The geometry of the bath 1 could also be used to control thickness as subsequently described. The p+ region could be similarly graded as shown, although the benefits would be smaller in this case. However, there exists other benefits through introducing lateral thickness variations such as by facilitating control of the rear geometry of the cell to allow optimization of light trapping within the cell.

Figure 6:
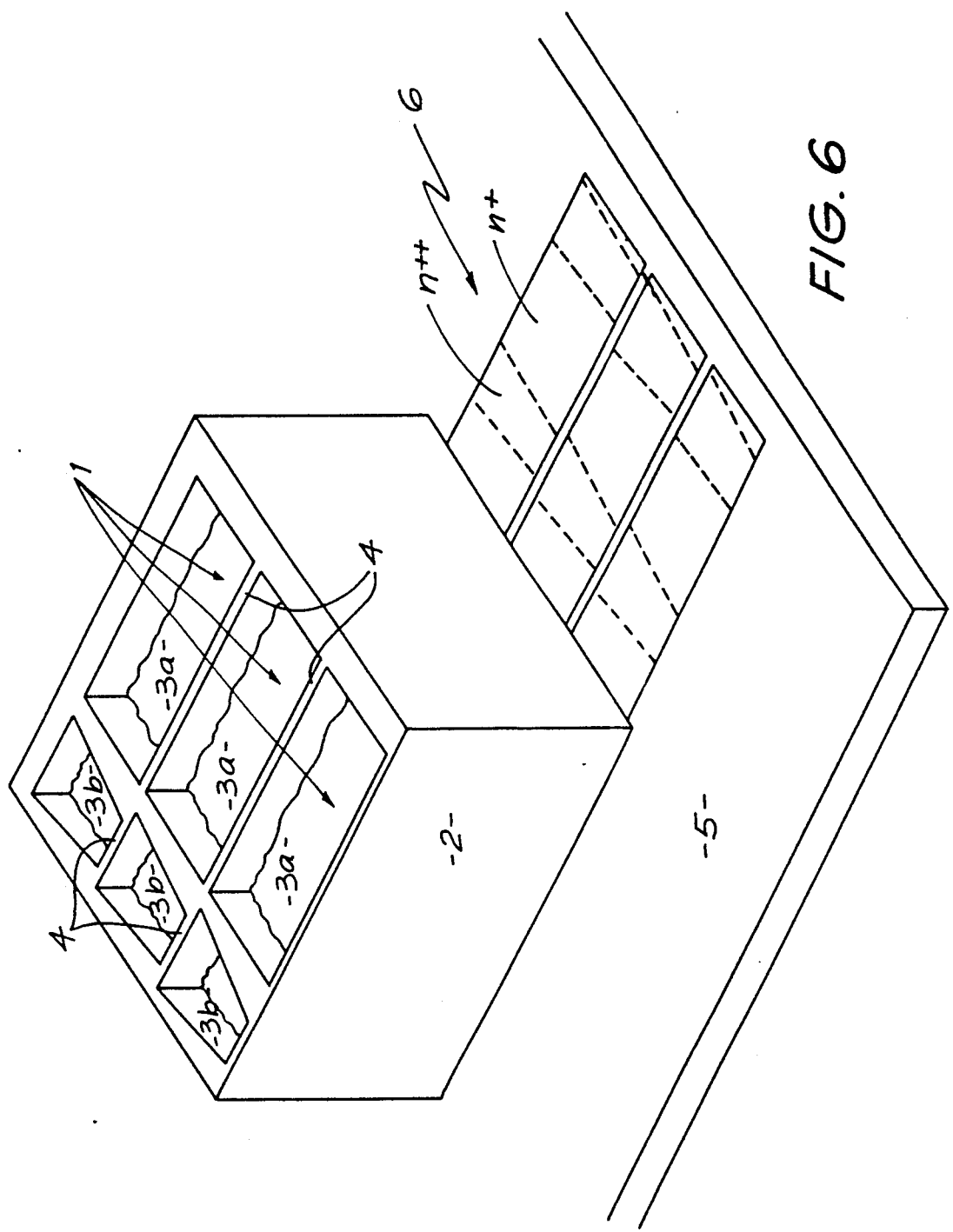
FIG. 6 illustrates a method of the invention for forming semiconductor strips having variations in doping concentration.

An alternative or complementary approach would be the use of "semiconductor fingers". A method of forming these, together with the resulting structure is shown in FIG. 6. By periodically cycling the temperature of the first bath 3b, highly doped n++ finger regions could be periodically deposited of width similar to the dimensions of the bath from which the solutions are deposited. These would serve to reduce the lateral resistance of the n+ layer of the cell while restricting the deleterious effects of excess doping and thickness to a fraction of the cell area. Contact between successive cells could be restricted to the n++ areas. This could reduce the area required for the isolation region in some implementations. Although the n++ regions are shown as sharply defined units in FIG. 6, the temperature variation in the corresponding bath or substrate could be controlled to smear this region out. In fact, a transition from n++ to n+ properties could be achieved by temperature control in a single bath, eliminating the need for the second bath 3a shown in FIG. 6. The nonrectangular shape of the first bath will promote a thickness variation in the final film 6. It should be noted that the structures described have the potential for not requiring metal contacts. This feature has numerous advantages. These include better durability by eliminating the potential for metal/silicon interactions, the elimination of losses due to shading, and the simplification of processing. However, metal contacts could also be included by deposition onto the supporting layer or deposited film by standard techniques. Solution growth of metal silicide contacts with an epitaxial relationship to silicon would be a particularly attractive option.

Figure 7:
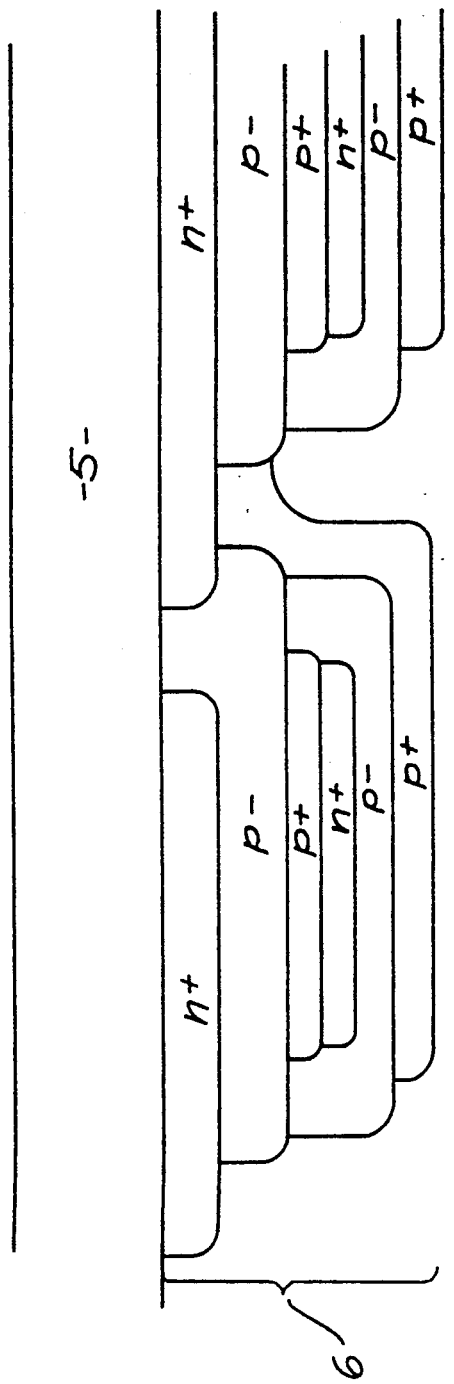
FIG. 7 is a cross-section of a solar cell device having stacked solar cells connected in series.
Figure 8:
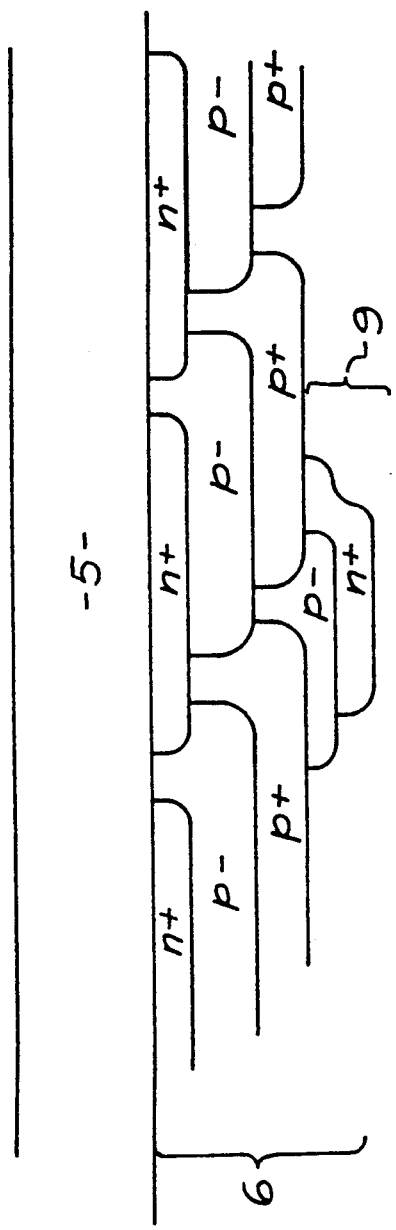
FIG. 8 is a cross-section of a solar cell device having cells protected by a bypass diode.

Multiple cells could be stacked on top of each other and series connected as shown in FIG. 7. In this case, the germanium content in the lightly doped regions could increase in each successive cell to take advantage of the increasing red content of the light as it passes through the cells. One advantage of such a tandem arrangement of cells is that it reduces the lateral current flow in each of the heavily doped regions of the cell. Another improvement could be the incorporation of a bypass diode 11 across each cell as shown in FIG. 8.

If the cell protected by the bypass diode 11 is generating less than its designed current output either due to partial shading of the module in the filed or manufacturing defects, the bypass diode 11 becomes forward biased and provides a current path around the cell. This not only improves the field reliability of the module, it also improves manufacturing yield. By incorporation of a few extra cells in the module, modules without all cells fully operational would still meet design specifications.

Figure 9:
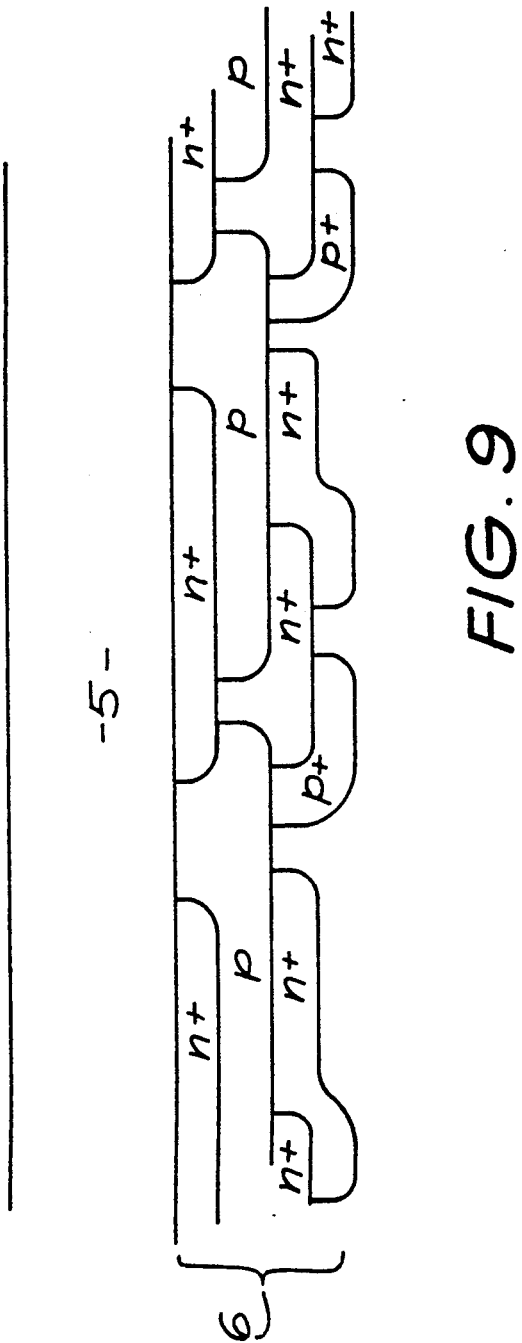
FIG. 9 is a cross-section of a solar cell device having double junction connections.

An alternative approach to building up cell structures would be the double junction approach of FIG. 9. In this case, the p-type layer would be more highly doped than for the structure of FIG. 3. This region forms a junction with the n+ regions immediately above and below it, with these junctions connected in parallel. If carrier lifetimes in the p-region are large so that diffusion lengths are larger than the thickness of this region, the generated current will partition itself between these two junctions in a way which will tend to take possible resistance losses along the top n+ layer into account. If diffusion lengths are shorter than this, a thin heavily doped p+ core could advantageously be used within the p-region to reduce its lateral resistance. The rear n+ region is deposited in two steps in the structure illustrated in FIG. 9 to allow the highest level of control of alignment to the p+ region providing the interconnection between successive cells.

Figure 10:
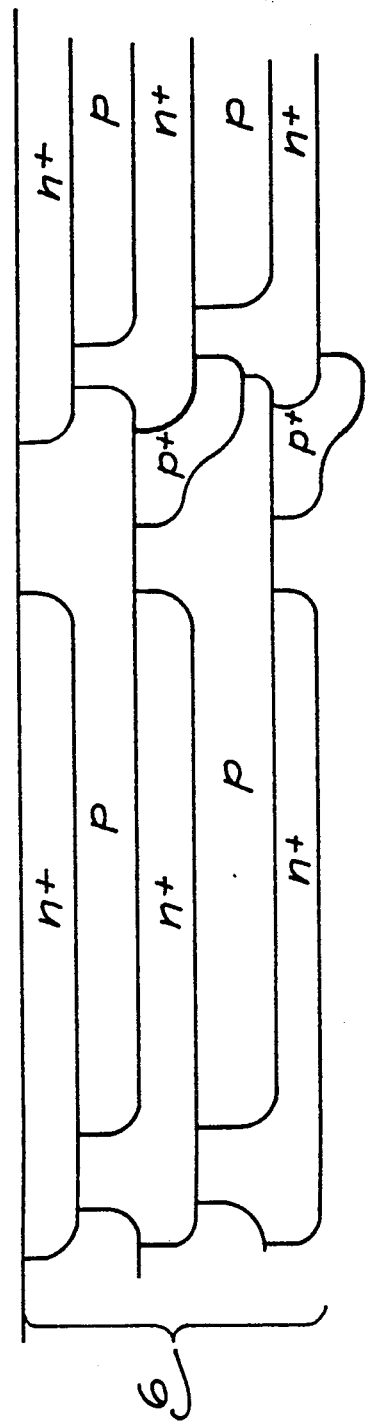
FIG. 10 is a cross section of a solar cell device having multiple stacked solar cells connected in parallel.

Again, multiple cells can be stacked on each other as shown in FIG. 10. In this case, all the cells in the stack are connected in parallel. The advantage of this arrangement is that it makes it easier for the diffusion lengths to be larger than the p-type region thicknesses. It also means that each layer has to carry less current, reducing lateral resistance loss. A by-pass diode can also be incorporated into the rear of the cell in a manner similar to that previously described.

Figure 11A:
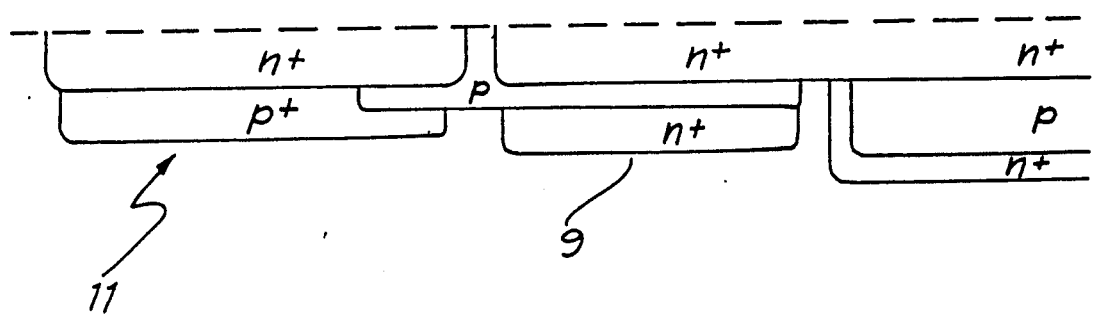
FIG. 11a is a cross-section of a solar cell device illustrating how deposited layers using the method of the invention can be used to incorporate regulating circuitry as an integral part of the solar cell device. The portion of the device depicted shows a Zener diode connected to an npn transistor, connected to a solar cell.
Figure 11B:
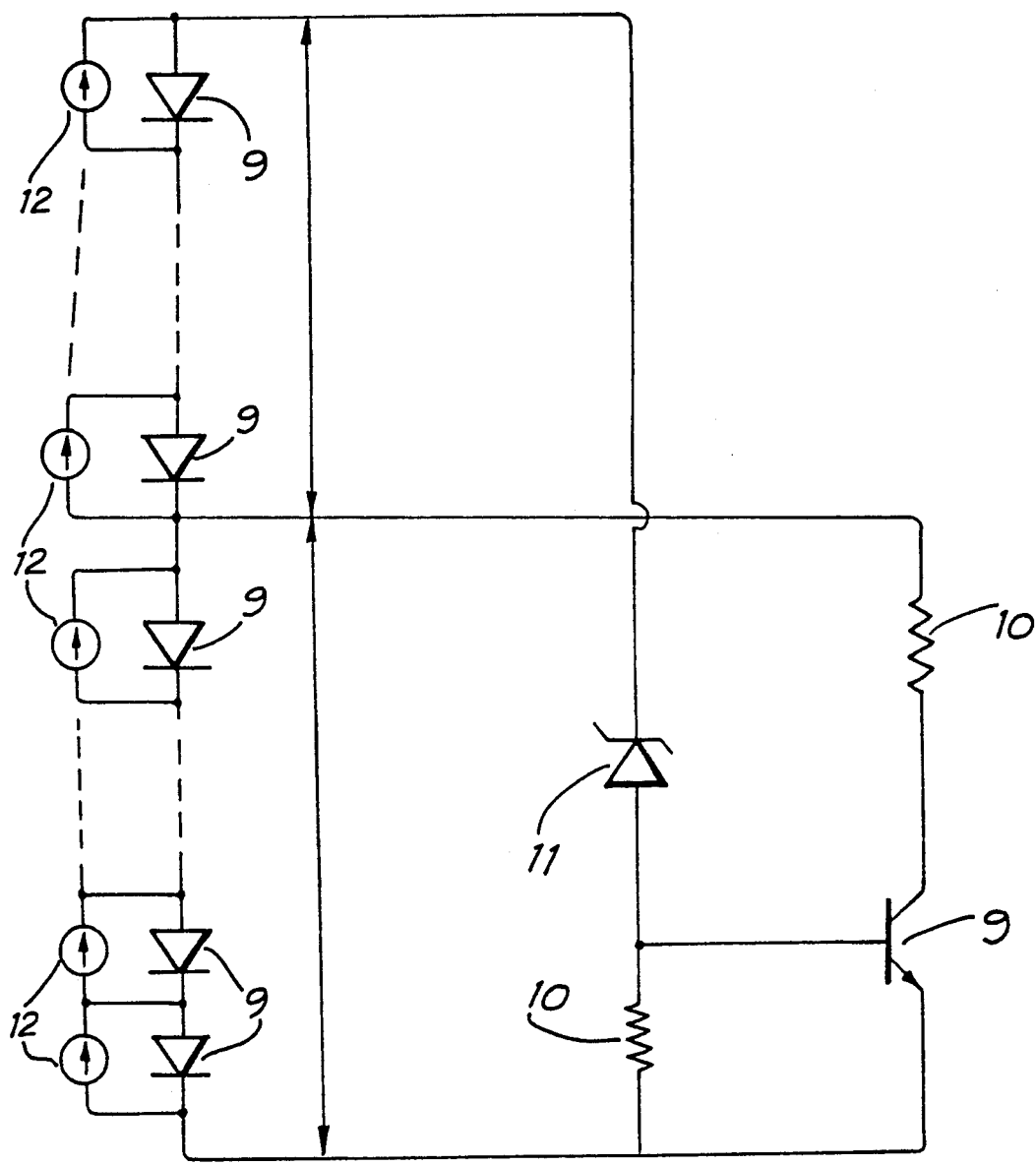
FIG. 11b is a schematic for a simple voltage regulator for a solar panel with (X+Y) series connected cells. X and Y can be varied as desired. This circuit is the representation of the deposited layers shown in FIG. 11a, with additional contacts to the transistor and to the Zener diode.

The flexibility of the described invention to produce doped or undoped semi-conductor layers in any desired position relative to one another facilitates the concept of including additional circuitry as an integral part of the panel (module) itself. Configurations of diodes 11, transistors 9 and resistors 10, such as in FIGS. 11a and 11b, can be incorporated into the structures using the described techniques and methods providing the potential to regulate the output from each module in a manner whereby the output was completely temperature independent for the range of operating temperatures likely to be experienced by the module in the field. FIG. 11a shows such a device having Zener diode 11 connected to npn transistor 9 by a thin p-type region which is then connected to the first solar cell. FIG. 11b shows X and Y series connected cells 12 connected to a simple voltage regulator, and is the circuit representation of the structure of FIG. 11a. In conjunction with the bypass diodes 11 (FIG. 8) it would then be feasible to have a module with an output (I-V curve) that would be independent of temperature changes, failures of small numbers of cell and/or shading of regions of the module.

It will be appreciated that the use of the present invention to incorporate additional circuitry as an integral part of the module, although being described in terms of regulating the module output, may be used to form any number of other desired effects or results.

Note that in all previously described structures, all n-type regions mentioned could be replaced by p-type regions provided p-type regions were simultaneously replaced by n-type. Note also that although the invention has been described specifically in terms of silicon layers including alloys with Ge, the invention is also applicable to other semiconductors and alloys. Similarly, although the specified method for growth of doped semi-conductor layers was by precipitation from molten solution, it will be appreciated that many of the discussed techniques, features and structures are equally applicable to other methods of film growth or formation.

The approaches described in the text accompanying FIGS. 1 to 11 could also be applied to solutions where the silicon is dissolved in molten metals and metal alloys other than those based on gold. For example, solutions based on Al, As, Bi, Cd, Cu, Ga, Hg, In, Ni, Pb, Pd, Pt, Sb, Sn, Tl and Zn or their alloys would also be suitable.

The approaches described in the text accompanying FIGS. 1 to 11 could also be modified in a way which will become apparent to those skilled in the art who have read this disclosure to allow the deposition of the patterns required for other applications such as large area displays. Since costs are less critical in this application, a variety of known techniques such as photolithography could be used in conjunction with low temperature deposition from the novel gold solutions to effect the desired patterns.

We claim:

1. A solution growth method for depositing a thin film semiconductor coating on a supporting substrate, the method comprising dissolving said semiconductor in a molten metal solvent to form a solution of said metal solvent and dissolved semiconductor, subsequently precipitating said semiconductor from the solution onto a supporting substrate, characterized in that said solvent is a mixture of:
    a first metal which forms a eutectic with said semiconductor having a eutectic temperature below the melting point of said first metal when substantially pure; and
    a second metal or mixture of second metals which, in their substantially pure state, have a melting point below the eutectic temperature of said first metal and said semiconductor and said second metal or mixture of second metals being substantially completely miscible with said first metal.

2. A method as defined in claim 1 wherein said first metal is gold.

3. The method as defined in claim 2, wherein the semiconductor is silicon.

4. The method as defined in claim 1 wherein said step of precipitating the semiconductor from the solution comprises controllably changing the temperature of the solution from a first temperature to a second temperature and wherein the solubility of the semiconductor in the solution at the second temperature is lower than the solubility of the semiconductor in the solution at the first temperature.

5. The method as defined in claim 4 wherein the second temperature is lower than the first temperature.

6. A method as defined in claim 2 wherein said step of precipitating the semiconductor from the solution comprises controllably changing the temperature of the solution from a first temperature to a second temperature and wherein the solubility of the semiconductor in the solution at the second temperature is lower than the solubility of the semiconductor in the solution at the first temperature.

7. The method as defined in claim 6 wherein the second temperature is lower than the first temperature.

8. The method as defined in claim 6 wherein the second temperature is higher than the first temperature and wherein a source of said second metal or mixture of second metals is maintained in contact with the solution at least during the step of precipitating said semiconductor from the solution so as to maintain said solution substantially saturated with said second metal or mixture of second metals.

9. The method as defined in claim 1 wherein, at least during precipitation of the semiconductor, the temperature of the solution is maintained substantially constant relative to time and is maintained at a temperature gradient through the solution ranging from a first temperature to a second temperature wherein at the second temperature the solubility of the semiconductor in the solution is lower than the solubility of the semiconductor in the solution at the first temperature and wherein the temperature of the solution at an area in contact with said substrate is substantially at said second temperature.

10. The method as defined in claim 9 wherein the second metal or mixture of second metals is at least one metal selected form the group consisting of: Bi, Cd, Ga, Hg, In, Pb, Sn, Tl, Zn, Ag, Cu, Ni, Pd and Pt.

11. The method as defined in claim 1 wherein the second metal or mixture of second metals is at least one metal selected form the group consisting of: Al, Bi, Cd, Ga, In, Pb, Sb, Sn and Tl.

12. The method of claim 4 wherein the support substrate is soda lime glass.

13. The method of claim 9 wherein the support substrate is soda lime glass.

14. A method of coating a glass sheet with thin film silicon comprising the steps of:
dissolving silicon in a solution of gold and tin wherein the gold and tin are present in a ratio of from 7:3 to 4:1 (gold:tin by weight to form a solution of silicon, gold and tin, the dissolving being carried out at a first temperature below about 600° C. until the silicon reaches approximately the saturation level of silicon in the solution;
wetting a surface of the glass sheet by contacting the solution with the sheet and maintaining the surface in contact with the solution;
precipitating silicon from the solution onto the surface by lowering the temperature of the solution; and
controlling the rate of growth and final thickness of the silicon film by controlling the rate of change of the solution temperature and the length of time the surface remains in contact with the solution.

15. A solution growth method for depositing a thin film semiconductor coating on a supporting substrate, the method comprising
dissolving said semiconductor in a molten metal solvent to form a solution of said metal solvent and dissolved semiconductor and subsequently precipitating said semiconductor from the solution onto a supporting substrate, characterized in that said solvent in a mixture of:
a first metal which forms a eutectic with said semiconductor, the first metal being selected from the group consisting of Au, Al, As, Bi, Cd, Cu, Ga, Hg, In, Ni, Pb, Pd, Sb, Sn, Tl and Zn; and
a second metal or mixture of second metals which, in their substantially pure state, have a melting point below the eutectic temperature of said first metal and said semiconductor and said second metal or mixture of second metals being substantially completely miscible with said first metal.

16. A method as defined in claim 15 wherein said first metal is gold.

17. The method as defined in claim 14, wherein the semiconductor is silicon.

18. The method as defined in claim 15, wherein said step of precipitating the semiconductor from the solution comprises controllably changing the temperature of the solution from a first temperature to a second temperature and wherein the solubility of the semiconductor in the solution at the second temperature is lower than the solubility of the semiconductor in the solution at the first temperature.

19. The method as defined in claim 18 wherein the second temperature is lower than the first temperature.

20. A method as defined in claim 16 wherein said step of precipitating the semiconductor from the solution comprises controllably changing the temperature of the solution from a first temperature to a second temperature and wherein the solubility of the semiconductor in the solution at the second temperature is lower than the solubility of the semiconductor in the solution at the first temperature.

21. The method as defined in claim 20 wherein the second temperature is lower than the first temperature.

22. The method as defined in claim 20 wherein the second temperature is higher than the first temperature and wherein a source of said second metal or mixture of second metals is maintained in contact with the solution at least during the step of precipitating said semiconductor form the solution so as to maintain said solution substantially saturated with said second metal or mixture of second metals.

23. The method as defined in claim 15 wherein, at least during precipitation of the semiconductor, the temperature of the solution is maintained substantially constant relative to time and is maintained at a temperature gradient through the solution ranging from a first temperature to a second temperature wherein at the second temperature the solubility of the semiconductor in the solution is lower than the solubility of the semiconductor in the solution at the first temperature and wherein the temperature of the solution at an area in contact with said substrate is substantially at said second temperature.

24. The method as defined in claim 23 wherein the second metal or mixture of second metals is at least one metal selected form the group consisting of: Bi, Cd, Ga, Hg, In, Pb, Sn, Tl, Zn, Ag, Cu, Ni, Pd and Pt.

25. The method as defined in claim 15 wherein the second metal or mixture of second metals is at least one metal selected form the group consisting of: Al, Bi, Cd, Ga, In, Pb, Sb, Sn and Tl.

26. The method of claim 18 wherein the support substrate is soda lime glass.

27. The method of claim 23 wherein the support substrate is soda lime glass.

* * * * *